United States Patent
Ben-bassat et al.

(10) Patent No.: US 12,388,483 B2
(45) Date of Patent: Aug. 12, 2025

(54) DYNAMIC POWER RAIL FLOATING FOR CDAC CIRCUITS

(71) Applicant: Intel Corporation, Santa Clara, CA (US)

(72) Inventors: Assaf Ben-bassat, Haifa (IL); Ofir Degani, Nes-Ammin (IL); Anna Nazimov, Haifa (IL); Naor Shay, Rehovot (IL); Ina Shternberg, Haifa (IL)

(73) Assignee: Intel Corporation, Santa Clara, CA (US)

( * ) Notice: Subject to any disclaimer, the term of this patent is extended or adjusted under 35 U.S.C. 154(b) by 472 days.

(21) Appl. No.: 17/997,663

(22) PCT Filed: Jun. 2, 2020

(86) PCT No.: PCT/US2020/035741
§ 371 (c)(1),
(2) Date: Nov. 1, 2022

(87) PCT Pub. No.: WO2021/247010
PCT Pub. Date: Dec. 9, 2021

(65) Prior Publication Data
US 2023/0179251 A1 Jun. 8, 2023

(51) Int. Cl.
*H04B 1/38* (2015.01)
*H03K 19/0948* (2006.01)
(Continued)

(52) U.S. Cl.
CPC .......... *H04B 1/40* (2013.01); *H03K 19/0948* (2013.01); *H03K 19/20* (2013.01); *H03M 1/66* (2013.01)

(58) Field of Classification Search
CPC ............ H04B 1/38; H04B 1/40; H04B 1/401; H03M 1/66; H03M 1/001; H03M 1/12; H03K 19/0948; H03K 19/20
See application file for complete search history.

(56) References Cited

U.S. PATENT DOCUMENTS

| 7,176,722 B2 | 2/2007 | Park et al. |
| 7,498,859 B2 | 3/2009 | Kim |

(Continued)

FOREIGN PATENT DOCUMENTS

WO 2014053911 A2 4/2014

OTHER PUBLICATIONS (Internet Document) E. Hager, T. Buckel, S. Schmick, A. Passamani, H. Pretl, and A. Springer. "A Quadrature Switched-Capacitor RF-DAC Drain Efficiency Model for Back-Off Operation."L IEEE public documents on Nov. 30, 2018, https://www.researchgate.net/publication/328761921_A_ Quadrature_Switched-Capacitor_RF-DAC_Drain_Efficiency_ Model_for_Back-Off_Operation.

(Continued)

*Primary Examiner* — Tuan Pham
(74) *Attorney, Agent, or Firm* — Banner & Witcoff Ltd.

(57) ABSTRACT

Techniques are described to address P-MOS bias temperature instability (BTI) stress issues within capacitive radio frequency digital-to-analog converter (CDAC) using a circuit architecture solution that functions to protect the transistors in various operating conditions. Techniques are disclosed that function to float one or both of the negative and positive power supply rail voltages higher or lower, respectively, for CDAC cells depending upon various operating scenarios. These scenarios include the transmitting state of individual CDAC cells and the transmitting state of the CDAC array in which the CDAC cell is implemented.

20 Claims, 4 Drawing Sheets

(51) Int. Cl.
*H03K 19/20* (2006.01)
*H03M 1/66* (2006.01)
*H04B 1/40* (2015.01)

(56) References Cited

U.S. PATENT DOCUMENTS

| | | |
|---|---|---|
| 7,834,667 B1 | 11/2010 | Wong |
| 9,071,265 B1 * | 6/2015 | Dey .................... H03M 1/0695 |
| 9,344,087 B2 | 5/2016 | Tsukuda |
| 9,432,012 B2 | 8/2016 | Liu et al. |
| 10,345,845 B1 * | 7/2019 | Chen .................... H03M 1/468 |
| 2004/0032289 A1 | 2/2004 | Stansfield et al. |
| 2005/0083221 A1 | 4/2005 | Seymour |
| 2008/0136696 A1 | 6/2008 | Walton |
| 2016/0065233 A1 * | 3/2016 | Vohora .................. H03M 1/661 |
| | | 341/150 |
| 2016/0173269 A1 | 6/2016 | Kuttner et al. |
| 2016/0285470 A1 | 9/2016 | Leuschner et al. |

OTHER PUBLICATIONS

Jul. 12, 2024 (TW) Search Report—App 109141442.
Aug. 13, 2020 (PCT) International Search Report—App PCT/US2020/35741.

* cited by examiner

DYNAMIC POWER RAIL FLOATING FOR CDAC CIRCUITS

TECHNICAL FIELD

Aspects described herein generally relate to capacitive radio frequency digital to analog converters (CDACs) and, more particularly, to the use of a dynamic floating power rails as part of CDAC circuit architectures.

BACKGROUND

To achieve optimal key performance indicators (KPIs), digital transmitters often implement core devices that operate at voltages that are greater than the limits designated by the process manufacturer. Doing so poses a reliability risk on the CDAC design for long term use.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
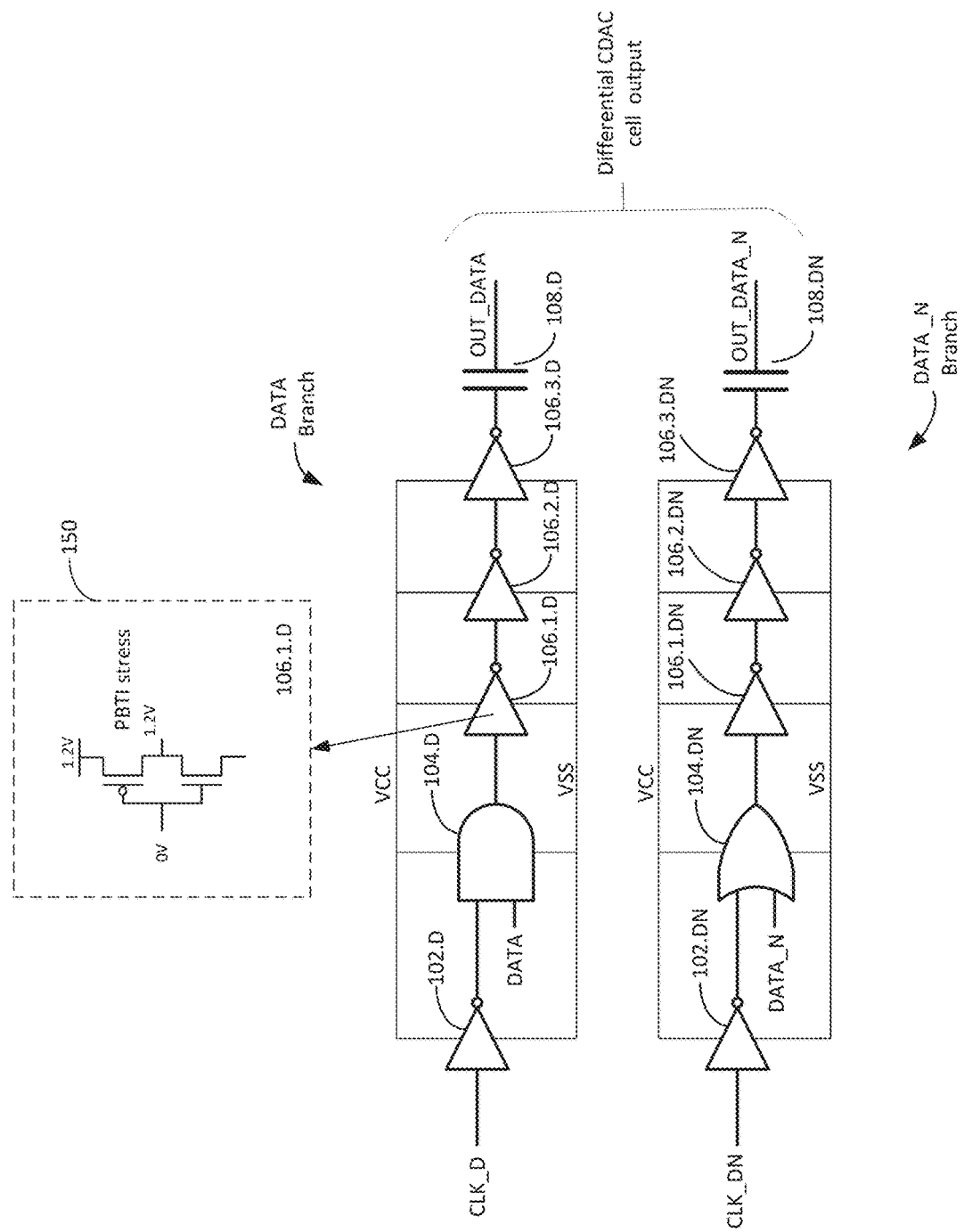
FIG. 1 illustrates an example circuit schematic for a conventional capacitive radio frequency digital-to-analog converter (CDAC)

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Again, the implementation of core devices operating at voltages exceeding designated manufacturer limits (e.g. 1.2V) introduces a reliability risk on capacitive CDAC designs. One of the most dangerous of these reliability risks is linked to P-MOS bias temperature instability (BTI) degradation. Previous architectures attempting to address these degradation issues, however, fail to support newer standards like WiFi-7. Furthermore, previous solutions include the use of I/O devices having a sufficiently high gate-length to reliably work at such higher voltages, but such I/O devices are slow and problematic to implement at higher operating frequencies (e.g. close to 7 GHz), and also introduce design inefficiency. Still further, previous solutions include the use of power gating by lowering the supply voltage when not needed. Although this technique may help protect the circuit when a CDAC array is off, it fails to protect reliability with respect to specific CDAC cells that are off when the CDAC array, in which the specific CDAC cells are implemented, is on. This state is very common for certain application such as WiFi, which often transmit using a high back-off, such that some cells are almost always off while the CDAC is on and data is being transmitted.

Therefore, the aspects described herein address these aforementioned issues using a circuit architecture that functions to protect the transistors in various operating conditions, including P-MOS BTI. To do so, the aspects described herein replace the typical power supply rail configuration within the CDAC cell circuit architecture to a floating negative supply voltage or a floating positive supply voltage. The use of a floating negative supply voltage in the CDAC cell functions to dynamically couple the negative supply rail of the CDAC logic gates to a voltage that is slightly higher than the negative supply voltage VSS for CDAC cells that are off in the CDAC array during a data transmission. Moreover, the use of a floating positive supply voltage in the CDAC cell functions to dynamically couple the positive supply of the CDAC logic gates to a voltage that is slightly lower than the supply voltage VCC for CDAC cells that are off in the CDAC array during a data transmission.

Doing so protects the "off" cells from the stressful BTI voltages that may form between the gate-to-source voltage (VGS) and the gate-to-drain voltage (VGD) of the transistors implemented in the inverters of the CDAC cell. The aspects of the circuit architecture as discussed herein also ensure that when the CDAC cell subsequently turns on from an off state, the floating negative power supply node voltage immediately returns to the negative power supply voltage for regular operation of the CDAC cell. As further discussed below, the aspects as described herein function to protect CDAC cells from reliability issues, and allow the CDAC cells to still work with voltages that exceed the manufacturer's designated voltage limits. In this way, CDAC cells incorporating the circuit architecture as discussed herein may comply with new standards, and function as part of a transmitter providing improved or optimized KPIs in terms of output power and efficiency as compared to conventional CDAC designs.

FIG. 1 illustrates an example conventional capacitive radio frequency digital-to-analog converter (CDAC). In general, CDAC arrays implement capacitor ratios to represent a digital word as a proportional analog voltage. Thus, a typical CDAC array may include any suitable number of individual CDAC cells depending upon a particular application, the desired resolution, and the size of the digital word that is converted to an analog value. Each CDAC cell, such as the CDAC cell 100 as shown in FIG. 1, may receive as input a specific data bit of a digital word. The output of each CDAC cell in the CDAC array, each having an input that is coupled to a different individual bit of the digital word, may then be combined to provide an overall analog representation of the digital word value within a range of maximum and minimum voltage values. For purposes of brevity, the aspects as discussed herein are with respect to an individual CDAC cell, and the additional CDAC cells and combining circuitry have been omitted for purposes of brevity.

As shown in FIG. 1, the CDAC cell 100 operates in a differential mode, with differential clock signal inputs CLK_D and CLK_DN being applied to the input of each respective data branch of the CDAC cell 100. For the CDAC cell 100, each branch corresponds to a bit of a digital word, and represents a particular logic value. For instance, the data branch may correspond to a bit having a logic value D, whereas the data_N branch may have a complementary logic value $\overline{D}$. Each data branch thus includes respective logic gates including a data input inverters 102.2.D, 102.DN, AND gate 104.D, OR gate 104.DN, inverters 106.1.D-106.3.D, 106.1.DN-106.3.DN, and output capacitors 108.D, 108.DN.

For the CDAC cell 100 as shown in FIG. 1, the CDAC cell 100 is considered active, or "on," when the input bit DATA is a logic high (e.g. logic '1'), and inactive, or "off," when the input bit DATA is a logic low (e.g. logic '0'). When the CDAC cell 100 is on (DATA='1'), then each of the inverters 106.1.D-106.3.D are clocking in data at a rate that is a function of the differential clock signal CLK_D (e.g., the RF rate). Similarly, each of the inverters 106.1.DN-106.3.DN clock in data at a rate that is a function of the differential clock signal CLK_DN (e.g., the RF rate). In this scenario, the inverters 106.1.D-106.3.D, 106.1.DN-106.3.DN are at a low risk of experiencing reliability issues due to RF recovery effects.

However, when the CDAC cell 100 is in the off state (DATA='0'), then the P-MOS components of the CDAC cell inverters 106.1.D-106.3.D and 106.1.DN-106.3.DN, which still conduct in the off state, suffer from BTI degradation, which negatively impacts the KPIs of the CDAC cell 100. An example of this effect is shown in more detail in the inset 150 of FIG. 1. Specifically, the inset 150 illustrates the architecture of the inverter 106.1.D, although the remaining inverters 106.2.D-106.3.D and 106.1.DN-106.3.DN may have a similar or identical architecture. As shown in FIG. 1, the positive power supply voltage VCC is 1.2V, which is assumed to exceed the manufacturer's recommendations as noted above, and the negative power supply VSS is 0V.

Thus, when the DATA bit is 0 and the CDAC cell 100 is in an off state, the output of the AND gate 104.D is 0V, which is provided to the input of the inverter 106.1.D. The CMOS architecture of the inverter 106.1.D includes a P-MOS transistor and an N-MOS transistor, as shown in the inset 150. The gate terminal of each of the P-MOS transistor and the N-MOS transistor as shown in the inset 150 are coupled to one another and form the input terminal of the inverter 106.1.D, whereas the drain terminal of the P-MOS and N-MOS transistors are coupled to one another and form the output of the inverter 106.1.D. Again, the source terminal of the P-MOS transistor as shown in the inset 150 is coupled to the positive power supply voltage VCC, which is 1.2V in this example. Thus, then the DATA bit is 0V as shown in the inset 150, the P-MOS transistor of the inverter 106.1.D conducts, whereas the N-MOS transistor does not. As a result, both the gate-source (VGS) and gate drain (VGD) voltages of the P-MOS transistor are at 1.2V, which exceeds manufacturer's recommended limitations and results in PBTI stress as shown.

As a practical matter, the voltage per CDAC cell cannot be individually changed or further reduced to protect the P-MOS circuits, so the aspects as described herein dynamically adjust the power rail voltages used by each CDAC cell depending on each cell's individual on/off state. An example of a circuit architecture that enables this adjustment to be made is further shown and described below with reference to FIG. 2, which illustrates an example circuit schematic of a dynamic power rail floating CDAC cell, in accordance with various aspects of the disclosure.

Figure 2:
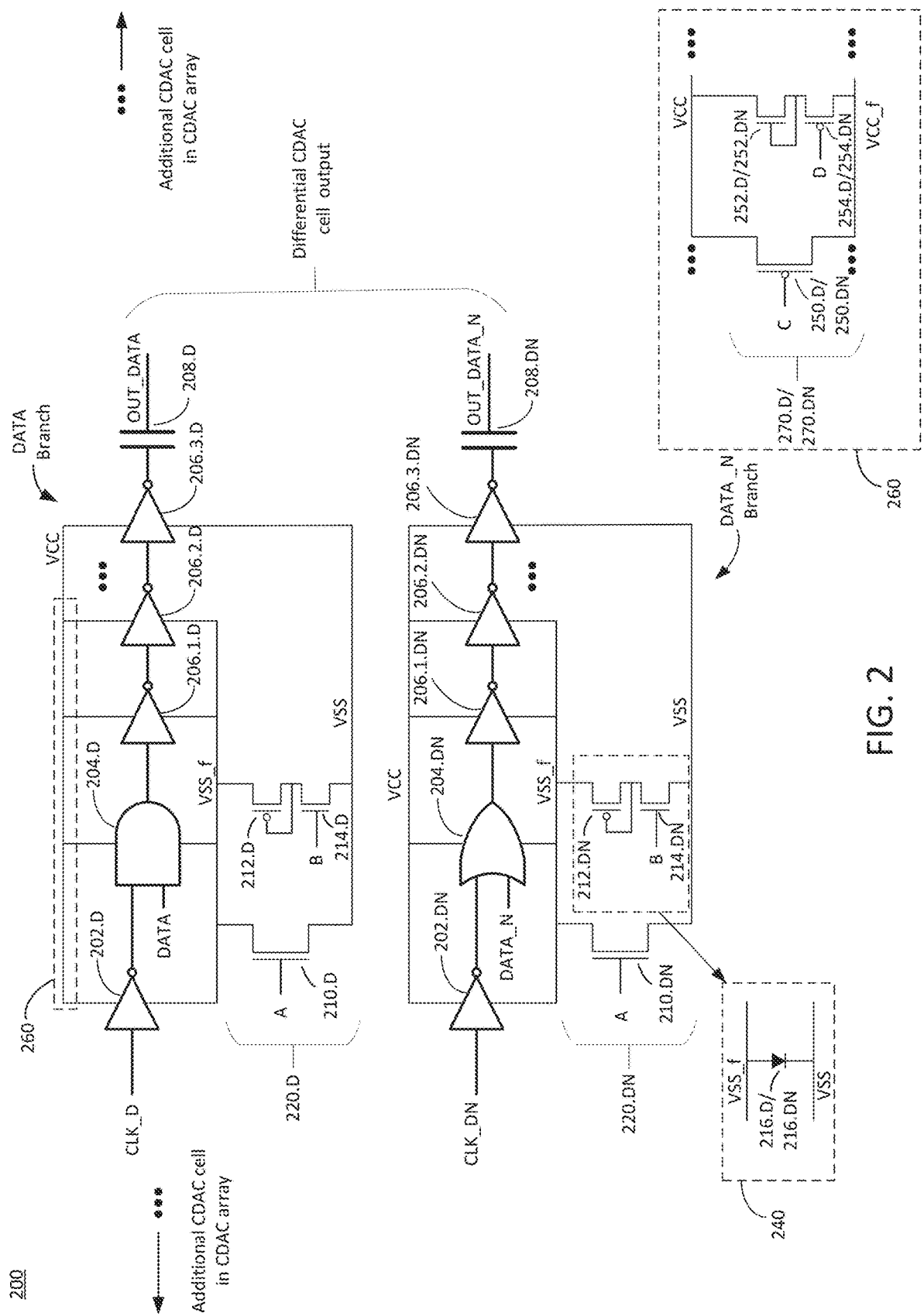
FIG. 2 illustrates an example circuit schematic of a dynamic power rail floating CDAC cell, in accordance with various aspects of the disclosure.

The CDAC cell 200 as shown in FIG. 2 includes several similar or identical components as the CDAC cell 100 as shown and described above with reference to FIG. 1, and the description of these common components will not be repeated here for purposes of brevity. However, the example CDAC cell 200 as shown in FIG. 2 is but one example of the aspects as discussed herein, which may include various modifications to the architecture of the CDAC cell 200 as shown in FIG. 2. For instance, the CDAC cell 200 is shown as implementing a differential cell architecture, but the aspects are not limited in this regard, and the CDAC cell 200 may also be implemented as a single-ended CDAC cell with a common clock and data inputs versus the differential clocks and data inputs as shown. Moreover, the aspects described herein may include different logic, alternative components, additional components, and/or fewer components than those shown in FIG. 2.

To provide some illustrative examples, the logic gates 204.D, 204.DN may be modified or replaced with different logic gates depending upon the default logic data state and/or a particular application in which the CDAC cell 200 is implemented. Further, one or more of the inverters 202.D, 206.1.D-206.3.D, 202.DN, and 206.1.DN-206.3.DN may be replaced with buffers, which may work in conjunction with any modifications to the logic gates 204.D, 204.DN to maintain logic compatibility. Additionally, although only three inverters 206.1.D-206.3.D, 206.1.DN-206.3.DN are shown in each respective data and data_N branch, aspects include implementing any suitable number of inverters (or alternatively, buffers) to ensure that the appropriate voltage levels are provided at the outputs DATA and DATA_N of the capacitors 208.D, 208.DN, respectively, while meeting any specified design requirements with respect to maximum signal delays.

To prevent the aforementioned BTI issues as discussed above with respect to the CDAC cell 100, the CDAC cell 200 includes the addition of logic circuits 220.D, 220.DN, which are coupled between the negative power supply rail of several components of the CDAC cell 200 and the negative power supply voltage node VSS, thus creating a floating negative power supply node VSS_f as shown in FIG. 2. In various aspects, the logic circuits 220.D and 220.DN may include any suitable number and/or type of components to facilitate the selective and dynamic coupling of the floating negative power supply node VSS_f to the negative power supply voltage node VSS.

For example, aspects include the logic circuitry 210.D, 210.DN each being implemented using any suitable number of transistors or other components. As an illustrative example, as shown in FIG. 2, the logic circuitry 220.D may include transistors 210.D, 212.D, and 214.D, whereas the logic circuitry 210.DN may include the transistors 210.DN, 212.DN, and 214.DN. Although the transistors as discussed herein and shown in FIG. 2 are represented as field-effect transistors (FETs), this is by way of example and not limitation, and aspects include the logic circuitry 220.D, 220.DN including any suitable type of transistors or other components that may provide desirable electronically controllable switching characteristics and/or floating voltage levels at the floating negative power supply node VSS_f under various operating conditions and for specific applications. For instance, and as further discussed below, the transistors 212.D, 214.D, 212.DN, and 214.DN may be replaced with respective diodes 216.D, 216.DN as shown in the inset 240 of FIG. 2. The logic circuitry 220.D, 220.DN may also include additional, fewer, or alternative components to ensure the appropriate control of the coupling state and voltage level of the floating negative power supply node VSS_f.

Regardless of the particular implementation of the logic circuitry 220.D, 220.DN, aspects include the logic circuitry 220.D, 220.DN selectively increasing the voltage at the floating negative power supply node VSS_f, which is coupled to the negative power supply rail of several of the logic gates of the CDAC cell 200 as shown in FIG. 2. The voltage increase may be, for instance, an increase from the voltage at the negative power supply voltage node VSS (e.g. ground or 0V) to a slightly higher voltage value (e.g. 0.3V). The voltage at the floating negative power supply node VSS_f may be increased, for example, to align with periods of time in which the inverters 202.D, 206.1.D-206.3.D, 202.DN, and 206.1.DN-206.3.DN would otherwise be subjected to BTI degradation, as discussed above. This increase in the voltage at the floating negative power supply node VSS_f may be a function of the voltage drop(s) caused by the various components implemented via each logic circuitry 220.D, 220.DN coupled between the floating negative power supply node VSS_f and the negative power supply voltage node VSS. For instance, the voltage drops may be approximately 0.3V such that, when the floating negative power supply node VSS_f is not shorted to the negative power supply voltage node VSS, the voltage at the floating negative power supply node VSS_f is approximately VSS+ 0.3V. As further discussed below, this effectively decreases the voltage drop across the inverters 202.D, 206.1.D-206.3.D, 202.DN, and 206.1.DN-206.3.DN, thereby mitigating BTI.

To do so, each respective logic circuit 220.D, 220.DN may selectively adjust the voltage at the floating negative power supply node VSS_f based upon various conditions. These conditions may be, for instance, the state of the individual CDAC cell 200 or the state of an overall CDAC cell array in which the CDAC cell 200 is implemented. The state of the CDAC cell 200 may be identified, for instance, based upon the logic of the input data bits DATA and DATA_N. As an illustrative example, the input bit DATA may represent a logic low value (e.g., logic 0) when the CDAC cell 200 is in an off state. Moreover, the entire CDAC cell array in which the CDAC cell 200 is implemented may be off when the device in which the CDAC cell array is implemented is not transmitting.

In other words, a CDAC cell array in a wireless device may include several CDAC cells, with each being implemented and controlled individually and separately in the same manner as the CDAC cell 200 as described with reference to FIG. 2. Aspects include the logic circuitry 220.D, 220.DN being selectively and dynamically controlled such that the control signals A and B may have different logic states for each CDAC cell 200 within an overall CDAC cell array, thus adjusting the voltage of the floating negative power supply voltage VSS_f for each CDAC cell within the CDAC array to distinguish between the state of each CDAC cell versus the state of the overall CDAC cell array in which the CDAC cell is implemented. Thus, although not shown in the Figures for purposes of brevity, aspects include the logic state of the control signals A and B being controlled by any suitable component(s) of a wireless device in which the CDAC cell array and the individual CDAC cells 200 are implemented. For instance, the logic state of the control signals A and B may be controlled by a processor of the wireless device in which the CDAC cell 200 is implemented.

To provide an illustrative example, a first scenario includes the individual CDAC cell 200 being on (i.e., data is transmitted on that specific CDAC cell because the DATA bit is a logic high value), and the CDAC cell array in which the CDAC cell 200 is implemented is assumed to be on (e.g. the wireless device is transmitting). In this case, there are no issues with BTI, and the control signal A may have a logic high value such that the N-type transistors 210.D and 210.DN conduct, thus shorting the floating negative power supply node VSS_f to the negative power supply node VSS. The control signal B may have an opposite logic value (e.g. logic low) such that the N-type transistors 214.D, 214.DN do not conduct. That is, when the CDAC cell 200 is in the on state, the floating negative power supply node VSS_f is shorted to the negative power supply node VSS_for each data branch, and the CDAC cell 200 operates in the same manner, in this example, as the CDAC cell 100 as shown in FIG. 1. Also, in this example, the logic of the control signal A as shown in FIG. 2 mirrors the logic of the DATA bit, and the logic of the control signal B as shown in FIG. 2 mirrors the logic of the DATA_N bit.

As another illustrative example, a second scenario includes the individual CDAC cell 200 being off (i.e., data is not transmitted on that specific CDAC cell because the DATA bit is a logic low value). However, despite the CDAC cell 200 being in an off state, the CDAC cell array in which the CDAC cell 200 is implemented is assumed to be on as in the previous example (e.g. the wireless device is transmitting). In this case, some of the inverters of the CDAC cell 200 are prone to stressful BTI voltages, which can be mitigated by increasing the voltage at the floating negative power supply node VSS_f. To do so, in this scenario the control signal A may have a logic low value such that the N-type transistors 210.D and 210.DN do not conduct. The control signal B, on the other hand, may have an opposite logic high value such that the N-type transistors 214.D, 214.DN do conduct, thus coupling the floating negative power supply node VSS_f to the negative power supply node VSS through the two series-connected transistors 212.D and 214.D for the data branch, and coupling the floating negative power supply node VSS_f to the negative power supply node VSS through the two series-connected transistors 212.DN, 214.DN for the data_N branch.

The logic states for the CDAC cell 200 may be any suitable voltage levels in accordance with the voltage VCC used for the positive power supply node VCC and the voltage VSS used for negative power supply node VSS. For simplicity, the voltages at the positive power supply node VCC and the negative power supply node VSS may alternatively be referred to herein as simply VCC and VSS, respectively, as shorthand. As an example, the logic low state may be identified with the voltage VSS, such as 0V for instance, whereas the logic high state may be identified with the voltage VCC, such as 1.2V, for example. Using these logic levels as an illustrative example in this scenario, the control signal A would have a logic low value of 0V, and the control signal B would have a logic high value of 1.2V. In this case, the floating negative power supply node VSS_f would, for each of the data branches data and data_N, have an increased voltage level value above 0V that is approximately equal to the threshold voltage $V_T$ associated with the p-n junction between the source and drain terminals of the P-type transistors 212.D, 212.DN, which is ~0.3V.

Thus, in this configuration the effective power rail for the components of the CDAC cell 200 coupled before the capacitor-driving inverters 206.3.D, 206.3.DN has a range between 0.3V-1.2V, or 0.9V. As a result, the maximum voltage over each transistor's node for the inverters 202.D, 206.1D, and 206.2.D for the data branch, and the inverters 202.DN, 206.1.DN, and 206.2.DN for the data_N branch is reduced from 1.2V to 0.9V, which is typically within each transistor's specification. Furthermore, the power supply rails for the capacitor-driving inverters 206.3.D, 206.3.DN provide the full range of 1.2V, as the negative supply rail of each capacitor-driving inverter 206.3.D, 206.3.DN is coupled to the negative power supply node VSS. However, as a result of the modifications as shown in FIG. 2, each inverter immediately preceding the capacitor-driving inverters 206.3.D, 206.3.DN in each respective data branch (i.e. inverters 206.2.D, 206.2.DN) includes a P-type transistor (see inset 150 in FIG. 1) that can be driven by a maximum voltage equal to that at the negative supply rail of the inverters 206.2.D, 206.2.DN, which is the increased voltage (e.g. 0.3V) of the floating negative power supply node VSS_f. As a result, the capacitor-driving inverters 206.3.D, 206.3.DN remain protected from BTI in this configuration.

As another illustrative example, a third scenario includes the entire CDAC cell array in which the CDAC cell 200 is implemented being in an off state (e.g. the wireless device is not transmitting and thus all of the CDAC cells in the array are off). In this case, both the control signals A and B may have a logic low value. This causes each of the transistors 210.D, 212.D, 214.D for the data branch to not conduct, and likewise causes each of the transistors 210.DN, 212.DN, 214.DN for the data_N branch not to conduct. Thus, the power supply rails at each data branch, which are coupled to the floating negative power supply node VSS_f, are decoupled from the negative power supply node VSS in this state. Doing so advantageously saves the leakage current that would otherwise flow through the transistors 212.D, 214.D between the floating negative power supply node VSS_f and the negative power supply node VSS in the data branch, and likewise saves the leakage current that would otherwise flow through the transistors 212.DN, 214.DN between the floating negative power supply node VSS_f and the negative power supply node VSS in the data_N branch. As a result, the voltage at the floating negative power supply node VSS_f will rise to a higher voltage level since the negative power supply node VSS is completely disconnected, and as a result the logic functionality of the CDAC cell 200 will not be maintained. However, this is an acceptable solution in favor of the leakage current mitigation, as the entire CDAC cell array is unused in this scenario.

Table 1 below summarizes the logic states and example voltage values for each of the three scenarios described above.

TABLE 1

|  | Device Transmitting CDAC cell ON | Device Transmitting CDAC cell OFF | Device not Transmitting |
| --- | --- | --- | --- |
| DATA | 1 | 0 | X |
| DATA_N | 0 | 1 | X |
| Control Signal A | 1 | 0 | 0 |
| Control Signal B | 0 | 1 | 0 |
| VSS_f | 0 V | ~0.3 V | >0.3 V |

In various aspects, the logic of the control signals A and B may be controlled in different ways depending upon the level of control that is desired for each of the various scenarios mentioned above. For instance, if current leakage during non-transmitting times is not a concern, then the control signals may be implemented by coupling the control signal lines for the control signals A and B to the DATA and the DATA_N bit lines, respectively, or in any other suitable configuration that enables the control signals A and B to mirror the logic of the DATA and DATA_N bit lines, respectively. However, to implement additional control of the CDAC cell 200 and to prevent or at least mitigate current leakage, the control signals A and B may be controlled via a suitable component of the wireless device in which the CDAC cell 200 is implemented. For instance, the control signals A and B may be coupled to appropriate drivers and/or other logic circuitry that causes the control signals A and B to have the desired logic states that may be independent of the logic states of the DATA and DATA_N bit lines, in various aspects.

Again, the logic circuitry 220.D, 220.DN may include additional, less, or alternate components than those shown in the configuration as shown in FIG. 2, which includes the use of transistors 212.D, 214.D, 212.DN, and 214.DN. For example, as shown in the inset 240 of FIG. 2, these transistors in each of the data and the data_N branches may be replaced by the diodes 216.D, 216.DN, respectively, which function to couple the floating negative power supply node VSS_f to the negative power supply node VSS in each of the data and data_N branches, respectively. In this configuration, the transistors 210.D, 210.DN, when conducting, function to provide a parallel path shorting the floating negative power supply node VSS_f to the negative power supply node VSS (e.g., when the CDAC cell 200 is on). Otherwise, when the transistors 210.D, 210.DN are not conducting, the voltage of the floating negative power supply node VSS_f is increased from VSS (e.g. 0V) to a value equal to the threshold voltage of the diodes 216.D, 216.DN (e.g. 0.3V). Although this configuration does not allow the use of current leakage mitigation techniques as noted above for scenarios in which no transmission is occurring and the entire CDAC array is off, this implementation still provides a simple and low-cost means for otherwise protecting the CDAC cell 200 from BTI stress when the CDAC cell 200 is off, as discussed above.

As yet another example, a combination of diodes and transistors may be implemented. For instance, the transistors 214.D, 214.DN may be implemented and the conductive state of each controlled via the logic state of the control signal B in each of the data and data_N branches, respectively. However, the transistors 212.D, 212.DN may alternatively be replaced with respective diodes having an anode coupled to the floating negative power supply node VSS_f and a cathode coupled to the source terminal of each of the transistors 214.D, 214.DN, respectively.

The aspects described above with respect to FIG. 2 provide various techniques for selectively and dynamically changing the voltage level of the negative power supply rail used by various components of the CDAC cell 200. In particular, the aspects described above provide a logic circuit architecture and control techniques for adjusting the voltage level of the floating negative power supply node VSS_f with respect to the negative power supply node VSS. However, this configuration is by way of example and not limitation. Other aspects include the CDAC cell 200 additionally or alternatively adjusting the positive power supply node VCC in a similar manner. For instance, a circuit section 260 is shown in FIG. 2 with respect to the data branch, and the details of the circuit section 260 are shown in greater detail in the corresponding inset in the lower right hand corner of FIG. 2. Although the details of this embodiment are illustrated with respect to the data branch, this is for purposes of brevity, and aspects include the data and/or the data_N branch including the logic circuitry 270.D, 270.DN as shown in the inset 260 as an alternative implementation of the logic circuitry 220.D, 220.DN or in addition to the logic circuitry 220.D, 220.DN.

For example, the logic circuitry 270.D, 270.DN for each of the data and data_N branches, respectively, may be coupled between the positive power supply node VCC and the positive power rail of the same components of the CDAC cell 200 that are shown in FIG. 2 that have their respective negative power rails coupled to the floating negative power supply node VSS_f. Thus, a floating positive power supply node VCC_f may be formed having a voltage level that is selectively decreased in the same manner that the floating negative power supply node VSS_f is increased to achieve the same or similar effective decrease in voltage range for the inverters of the CDAC cell 200. Continuing this example, the logic circuitry 270.D, 270.DN may include transistors 250.D, 250.DN, the conductive state of which may be controlled by the logic state of a control signal C in a similar manner as explained above with respect to the control signal A as explained above, with logic compensation being made by substituting a P-type transistor for the N-type transistor in the logic circuitry 220.D, 220.DN. Further, the logic circuitry 270.D, 270.DN may include transistors 252.D, 252.DN and 254.D, 254.DN, the conductive state of which may be controlled by the logic state of a control signal D in a similar manner as the control signal B as explained above, with logic compensation being made by substituting the N-type transistors 252.D, 252.DN for the P-type transistors 212.D, 212.DN, and further substituting the P-type transistors 254.D, 254.DN for the N-type transistors 214.D, 214.DN in the logic circuitry 220.D, 220.DN. Of course, additional modifications to the logic circuitry 270.D, 270.DN may also be made, such as the use of diodes in place of one or both of the transistors 252.D, 254.D and/or 252.DN, 254.DN, for instance, as discussed above with respect to the logic circuitry 220.D, 220.DN.

Figure 3:
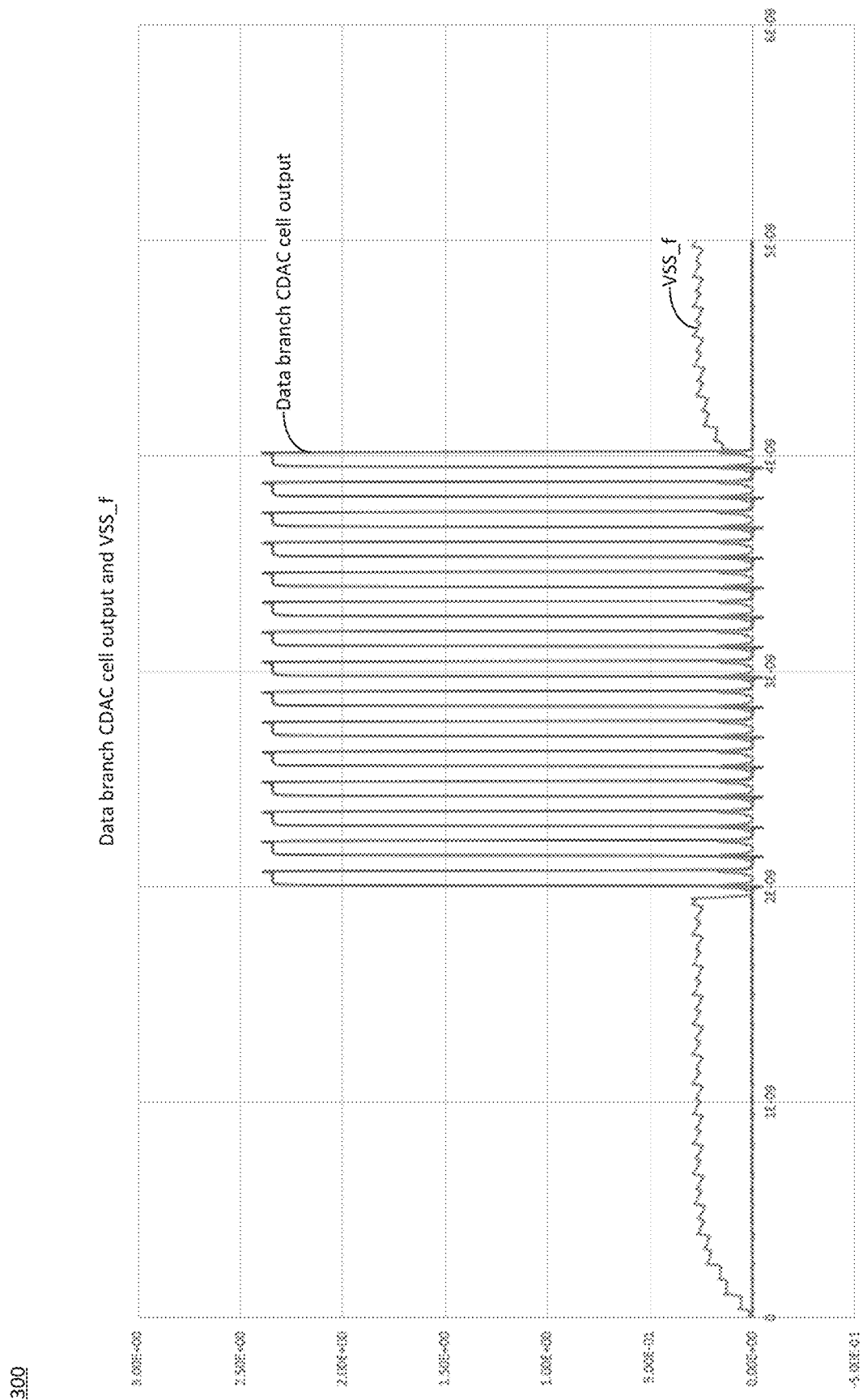
FIG. 3 illustrates an example graph of the results of a simulation in accordance with the CDAC circuit architecture as shown in FIG. 2.

FIG. 3 illustrates an example graph of the results of a simulation in accordance with the CDAC circuit architecture as shown in FIG. 2. As shown in FIG. 3, the graph 300 shows voltage traces over time for an output associated with the data branch path of the CDAC cell 200 and the floating negative power supply node VSS_f. The voltage traces in the graph 300 demonstrate the operation of the data branch of the circuit of the CDAC cell 200 as shown in FIG. 2 in both on and off states, as well as the transition between them. As can be seen by the graph 300, the output signal of the data branch of the CDAC cell 200 (e.g. OUT_DATA) is not affected by the modified circuit architecture that introduces the floating negative power supply node VSS_f. The output of the data_N branch (e.g. OUT_DATA_N) may act in a similar or identical manner, and thus this simulation has been omitted for purposes of brevity.

Figure 4:
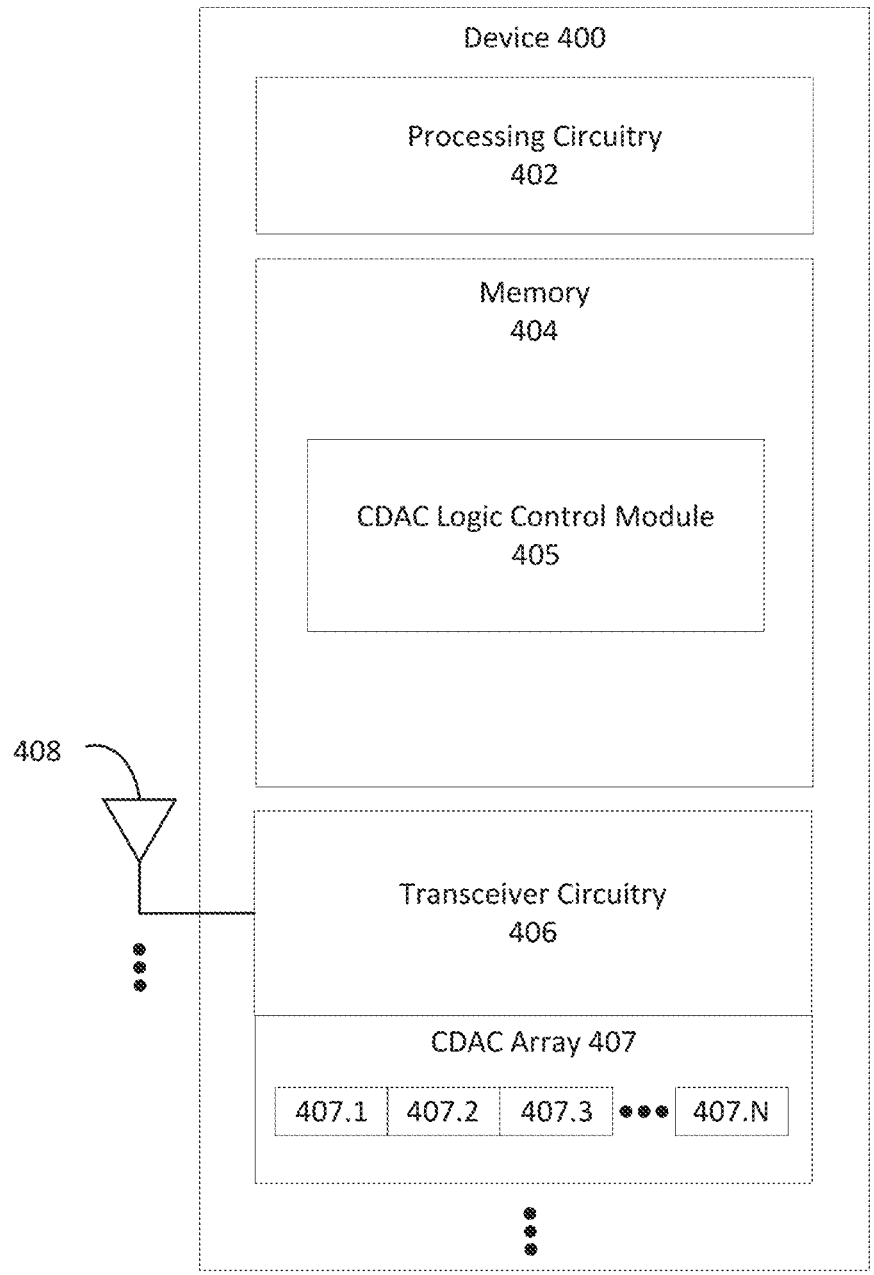
FIG. 4 illustrates a block diagram of an example device, in accordance with various aspects of the disclosure.

FIG. 4 illustrates a block diagram of an example device, in accordance with various aspects of the disclosure. In various aspects, device 400 may be implemented as any suitable type of device configured to transmit and/or receive wireless signals in accordance with any suitable number and/or type of communication protocols. For instance, the device 400 may be implemented as a user equipment (UE) such as a mobile phone, tablet, laptop computer, etc. To provide additional examples, the device 400 may be implemented as an access point or base station. The device 400 may implement one or more aspects as described herein to facilitate transmitting wireless signals using one or more CDAC arrays, each of which may include any suitable number of CDAC cells, for example, as further described below.

In an aspect, the device 400 may include processor circuitry 402, a memory 404, and transceiver circuitry 406, which may be coupled to one or more respective antennas 408. The components shown in FIG. 4 are provided for ease of explanation, and aspects include device 400 including additional, less, or alternative components as those shown in FIG. 4. For example, device 400 may include one or more power sources, display interfaces, peripheral devices, ports, front end components, etc. To provide additional examples, the device 400 may further include one or more receivers, or the transceiver circuitry 406 may be implemented as transmitters capable of transmitting wireless signals via one or more of the antennas 408.

In an aspect, the various components of device 400 may be identified with functionality further described herein with reference to the dynamic and selective control of the voltage of a positive or negative power supply rail used by various logic gates of a CDAC cell, which may form part of an overall CDAC cell array. For example, the wireless device 400 may be configured to transmit wireless signals via the transceiver circuitry using a CDAC array 407 in conjunction with the antenna(s) 408. The CDAC array 407 may include any suitable number N of CDAC cells 407.1-407.N, and one or more (or all) of the CDAC cells 407.1-407.N may be identified, for instance, with the CDAC cell 200 as discussed, for example, with reference to FIG. 2. The CDAC array 407 may be one of several CDAC arrays used by the device 400 when transmitting wireless signals, and one or more (or all) of the CDAC arrays may likewise include CDAC cells that operate in the manner as described herein with reference to the CDAC cell 200 as shown in FIG. 2.

To do so, processor circuitry 402 may be configured as any suitable number and/or type of computer processors, which may facilitate control of the device 400 as discussed herein. In some aspects, processor circuitry 402 may be identified with a baseband processor (or suitable portions thereof) implemented by the device 400. In other aspects, the processor circuitry 402 may be identified with one or more processors implemented by the device 400 that are separate from the baseband processor. In any event, aspects include the processor circuitry 402 being configured to carry out instructions to perform arithmetical, logical, and/or input/output (I/O) operations, and/or to control the operation of one or more components of the device 400. For example, the processor circuitry 402 can include one or more microprocessors, memory registers, buffers, clocks, etc. Moreover, aspects include processor circuitry 402 communicating with and/or controlling functions associated with the memory 404, the transceiver circuitry 406, and/or the CDAC array 407 (which may be included as part of the transceiver circuitry 406 or considered a separate component of the wireless device 400). This may include, for example, controlling and/or arbitrating transmit and/or receive functions of the device 400, performing one or more baseband processing functions (e.g., media access control (MAC), encoding/decoding, modulation/demodulation, data symbol mapping, error correction, etc.).

In an aspect, the memory 404 stores data and/or instructions such that, when the instructions are executed by the processor circuitry 402, the processor circuitry 402 performs the various functions described herein. The memory 404 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 404 can be non-removable, removable, or a combination of both.

For example, the memory 404 may be implemented as a non-transitory computer readable medium storing one or more executable instructions such as, for example, logic, algorithms, code, etc. As further discussed herein, the instructions, logic, code, etc., stored in the memory 404 are represented by the various modules as shown in FIG. 4, which may enable the aspects disclosed herein to be functionally realized. The modules shown in FIG. 4 are provided for ease of explanation regarding the functional association between hardware and software components. Thus, aspects include the processor circuitry 402 executing the instructions stored in these respective modules in conjunction with one or more hardware components to perform the various functions associated with the aspects as further discussed herein.

In an aspect, the executable instructions stored in CDAC logic control module 405 may facilitate, in conjunction with the processor circuitry 402, the selection of appropriate logic control signals based upon the state of the CDAC array 407 (e.g. whether or not data is being transmitted), the state of individual CDAC cells 407.1-407.N within the CDAC cell array (e.g., whether a specific CDAC cell within an array is transmitting data), and/or any other CDAC cells or arrays that may be implemented by the device 400.

For example, as discussed with reference to the CDAC cell 200 in FIG. 2, the executable instructions stored in CDAC logic control module 405 may enable the transmitting state of the device 400 to be ascertained, as well as the on or off state of the CDAC array 407 and/or the individual CDAC cells 407.1-407.N. Thus, the CDAC logic control module 405 enables the selection of the appropriate logic levels for the control signals (e.g., control signals A and B) for each CDAC cell 407.1-407.N in an independent manner. Doing so ensures that the power supply rails for the logic gates for each CDAC cell 407.1-407.N are selectively and dynamically coupled to the appropriate voltages at the floating negative power supply node VSS_f and/or the floating positive power supply node VCC_f in various scenarios, as discussed above with respect to the CDAC cell 200 of FIG. 2.

EXAMPLES

The following examples pertain to further aspects.

Example 1 is a capacitive radio frequency digital to analog converter (CDAC) cell, comprising: a plurality of logic gates; and logic circuitry coupled to (i) a power supply node of the CDAC cell, and (ii) a power supply rail of at least one of the plurality of logic gates, wherein the logic circuitry is configured to selectively adjust a voltage provided at the power supply rail by coupling the power supply node to the power supply rail based upon a transmitting state of the CDAC cell.

In Example 2, the subject matter of Example 1, wherein: the power supply node is a negative power supply node, the power supply rail is a negative power supply rail, and the logic circuitry is configured to adjust the voltage provided at the power supply rail to be one of (i) a voltage associated with the negative power supply node, or (ii) a voltage higher than the voltage associated with the negative power supply node.

In Example 3, the subject matter of one or more of Examples 1-2, wherein the logic circuitry includes a first transistor configured to selectively couple the power supply node to the power supply rail based upon a logic state of a first control signal.

In Example 4, the subject matter of one or more of Examples 1-3, wherein the logic circuitry further includes a second transistor and a third transistor connected in series with one another, and wherein the second transistor and the third transistor are each configured to selectively couple the power supply node to the power supply rail through the series-connected second transistor and third transistor based upon a logic state of a second control signal.

In Example 5, the subject matter of one or more of Examples 1-4, wherein the logic circuitry further includes a diode coupled between the power supply node and the power supply rail, the diode being configured to provide a voltage at the power supply rail that is greater than that of the power supply node when the first transistor is not conducting based upon the logic state of the first control signal.

In Example 6, the subject matter of one or more of Examples 1-5, wherein: the CDAC cell is a differential CDAC cell including a first data branch and a second data branch, the plurality of logic gates include a first set of logic gates in the first data branch and a second set of logic gates in the second branch, and the logic circuitry includes: a first set of logic circuitry configured to selectively adjust a voltage provided at a power supply rail of at least one of the first set of logic gates in the first data branch by coupling the power supply node to the power supply rail of the first set of logic gates in the first data branch based upon a transmitting state of the CDAC cell, and a second set of logic circuitry configured to selectively adjust a voltage provided at a power supply rail of at least one of the second set of logic gates in the second data branch by coupling the power supply node to the power supply rail of the second set of logic gates in the second data branch based upon a transmitting state of the CDAC cell.

In Example 7, the subject matter of one or more of Examples 1-6, wherein the at least one of the plurality of logic gates includes an inverter.

In Example 8, the subject matter of one or more of Examples 1-7, wherein the logic circuitry is configured to couple the power supply node to the power supply rail to cause the power supply rail to have a voltage equal to that of the power supply node when the transmitting state of the CDAC cell is such that the CDAC cell is on during a data transmission.

In Example 9, the subject matter of one or more of Examples 1-8, wherein the logic circuitry is configured to couple the power supply node to the power supply rail to cause the power supply rail to have a voltage that is higher than that of the power supply node when the transmitting state of the CDAC cell is such that the CDAC cell is off during a data transmission.

In Example 10, the subject matter of one or more of Examples 1-9, wherein the logic circuitry is configured to decouple the power supply node from the power supply rail when the transmitting state of the CDAC cell is such that a data transmission is not occurring.

Example 11 is a wireless device, comprising: processing circuitry; transceiver circuitry including a plurality of capacitive radio frequency digital to analog converter (CDAC) cells forming a CDAC array, each CDAC cell from among the CDAC array including: a plurality of logic gates; and logic circuitry coupled to (i) a power supply node of the CDAC cell, and (ii) a power supply rail of at least one of the plurality of logic gates; and a memory configured to store executable instructions that, when executed by the processing circuitry, causes the logic circuitry to selectively adjust a voltage provided at the power supply rail of the CDAC cell within the CDAC array by coupling the power supply node of the CDAC cell to the power supply rail of the CDAC cell based upon a transmitting state of the CDAC cell.

In Example 12, the subject matter of Example 11, wherein: the power supply node is a negative power supply node, the power supply rail is a negative power supply rail, and the logic circuitry selectively adjusts the voltage provided at the power supply rail of the CDAC cell to be one of (i) a voltage associated with the negative power supply node, or (ii) a voltage higher than the voltage associated with the negative power supply node.

In Example 13, the subject matter of one or more of Examples 11-12, wherein the logic circuitry includes a first transistor configured to selectively couple the power supply node to the power supply rail based upon a logic state of a first control signal that is controlled via the processing circuitry executing the executable instructions stored in the memory.

In Example 14, the subject matter of one or more of Examples 11-13, wherein the logic circuitry further includes a second transistor and a third transistor connected in series with one another, and wherein the second transistor and the third transistor are each configured to selectively couple the power supply node to the power supply rail through the series-connected second transistor and third transistor based upon a logic state of a second control signal that is controlled via the processing circuitry executing the executable instructions stored in the memory.

In Example 15, the subject matter of one or more of Examples 11-14, wherein the logic circuitry further includes a diode coupled between the power supply node and the power supply rail, the diode being configured to provide a voltage at the power supply rail that is greater than that of the power supply node when the first transistor is not conducting based upon the logic state of the first control signal that is controlled via the processing circuitry executing the executable instructions stored in the memory.

In Example 16, the subject matter of one or more of Examples 11-15, wherein: the CDAC cell is a differential CDAC cell including a first data branch and a second data branch, the plurality of logic gates include a first set of logic gates in the first data branch and a second set of logic gates in the second branch, and the logic circuitry includes: a first set of logic circuitry configured to selectively adjust a voltage provided at a power supply rail of at least one of the first set of logic gates in the first data branch by coupling the power supply node to the power supply rail of the first set of logic gates in the first data branch based upon a transmitting state of the CDAC cell, and a second set of logic circuitry configured to selectively adjust a voltage provided at a power supply rail of at least one of the second set of logic gates in the second data branch by coupling the power supply node to the power supply rail of the second set of logic gates in the second data branch based upon a transmitting state of the CDAC cell.

In Example 17, the subject matter of one or more of Examples 11-16, wherein the at least one of the plurality of logic gates includes an inverter.

In Example 18, the subject matter of one or more of Examples 11-17, wherein the logic circuitry is configured to couple the power supply node to the power supply rail to cause the power supply rail to have a voltage equal to that of the power supply node when the transmitting state of the CDAC cell is such that the CDAC cell is on during a data transmission via the wireless device.

In Example 19, the subject matter of one or more of Examples 11-18, wherein the logic circuitry is configured to couple the power supply node to the power supply rail to cause the power supply rail to have a voltage that is higher than that of the power supply node when the transmitting state of the CDAC cell is such that the CDAC cell is off during a data transmission via the wireless device.

In Example 20, the subject matter of one or more of Examples 11-19, wherein the logic circuitry is configured to decouple the power supply node from the power supply rail when the transmitting state of the CDAC cell is such that a data transmission is not occurring via the wireless device.

Example 21 is a capacitive radio frequency digital to analog converter (CDAC) cell, comprising: a plurality of logic means; and logic circuitry means coupled to (i) a power supply node of the CDAC cell, and (ii) a power supply rail of at least one of the plurality of logic means, wherein the logic circuitry means selectively adjusts a voltage provided at the power supply rail by coupling the power supply node to the power supply rail based upon a transmitting state of the CDAC cell.

In Example 22, the subject matter of Example 21, wherein: the power supply node is a negative power supply node, the power supply rail is a negative power supply rail, and the logic circuitry means adjusting the voltage provided at the power supply rail to be one of (i) a voltage associated with the negative power supply node, or (ii) a voltage higher than the voltage associated with the negative power supply node.

In Example 23, the subject matter of one or more of Examples 21-22, wherein the logic circuitry means includes a first transistor that selectively couples the power supply node to the power supply rail based upon a logic state of a first control signal.

In Example 24, the subject matter of one or more of Examples 21-23, wherein the logic circuitry means further includes a second transistor and a third transistor connected in series with one another, and wherein the second transistor and the third transistor each selectively coupling the power supply node to the power supply rail through the series-connected second transistor and third transistor based upon a logic state of a second control signal.

In Example 25, the subject matter of one or more of Examples 21-24, wherein the logic circuitry means further includes a diode coupled between the power supply node and the power supply rail, the diode providing a voltage at the power supply rail that is greater than that of the power supply node when the first transistor is not conducting based upon the logic state of the first control signal.

In Example 26, the subject matter of one or more of Examples 21-25, wherein: the CDAC cell is a differential CDAC cell including a first data branch and a second data branch, the plurality of logic means include a first set of logic gates in the first data branch and a second set of logic gates in the second branch, and the logic circuitry means includes: a first set of logic circuitry means that selectively adjusts a voltage provided at a power supply rail of at least one of the first set of logic gates in the first data branch by coupling the power supply node to the power supply rail of the first set of logic gates in the first data branch based upon a transmitting state of the CDAC cell, and a second set of logic circuitry means that selectively adjusts a voltage provided at a power supply rail of at least one of the second set of logic gates in the second data branch by coupling the power supply node to the power supply rail of the second set of logic means in the second data branch based upon a transmitting state of the CDAC cell.

In Example 27, the subject matter of one or more of Examples 21-26, wherein the at least one of the plurality of logic means includes an inverter.

In Example 28, the subject matter of one or more of Examples 21-27, wherein the logic circuitry means couples the power supply node to the power supply rail to cause the power supply rail to have a voltage equal to that of the power supply node when the transmitting state of the CDAC cell is such that the CDAC cell is on during a data transmission.

In Example 29, the subject matter of one or more of Examples 21-28, wherein the logic circuitry means couples the power supply node to the power supply rail to cause the power supply rail to have a voltage that is higher than that of the power supply node when the transmitting state of the CDAC cell is such that the CDAC cell is off during a data transmission.

In Example 30, the subject matter of one or more of Examples 21-29, wherein the logic means decouples the power supply node from the power supply rail when the transmitting state of the CDAC cell is such that a data transmission is not occurring.

Example 31 is a wireless device, comprising: processing means; transceiver means including a plurality of capacitive radio frequency digital to analog converter (CDAC) cells forming a CDAC array, each CDAC cell from among the CDAC array including: a plurality of logic means; and logic circuitry means coupled to (i) a power supply node of the CDAC cell, and (ii) a power supply rail of at least one of the plurality of logic gates; and a memory configured to store executable instructions that, when executed by the processing means, causes the logic circuitry means to selectively adjust a voltage provided at the power supply rail of the CDAC cell within the CDAC array by coupling the power supply node of the CDAC cell to the power supply rail of the CDAC cell based upon a transmitting state of the CDAC cell.

In Example 32, the subject matter of Example 31, wherein: the power supply node is a negative power supply node, the power supply rail is a negative power supply rail, and the logic circuitry means selectively adjusts the voltage provided at the power supply rail of the CDAC cell to be one of (i) a voltage associated with the negative power supply node, or (ii) a voltage higher than the voltage associated with the negative power supply node.

In Example 33, the subject matter of one or more of Examples 31-32, wherein the logic circuitry means includes a first transistor that selectively couples the power supply node to the power supply rail based upon a logic state of a first control signal that is controlled via the processing means executing the executable instructions stored in the memory.

In Example 34, the subject matter of one or more of Examples 31-33, wherein the logic circuitry means further includes a second transistor and a third transistor connected in series with one another, and wherein the second transistor and the third transistor each selectively coupling the power supply node to the power supply rail through the series-connected second transistor and third transistor based upon a logic state of a second control signal that is controlled via the processing means executing the executable instructions stored in the memory.

In Example 35, the subject matter of one or more of Examples 31-34, wherein the logic circuitry means further includes a diode coupled between the power supply node and the power supply rail, the diode providing a voltage at the power supply rail that is greater than that of the power supply node when the first transistor is not conducting based upon the logic state of the first control signal that is controlled via the processing circuitry executing the executable instructions stored in the memory.

In Example 36, the subject matter of one or more of Examples 31-35, wherein: the CDAC cell is a differential CDAC cell including a first data branch and a second data branch, the plurality of logic means including a first set of logic means in the first data branch and a second set of logic means in the second branch, and the logic circuitry means includes: a first set of logic circuitry means for selectively adjusting a voltage provided at a power supply rail of at least one of the first set of logic gates in the first data branch by coupling the power supply node to the power supply rail of the first set of logic gates in the first data branch based upon a transmitting state of the CDAC cell, and a second set of logic circuitry means for selectively adjusting a voltage provided at a power supply rail of at least one of the second set of logic means in the second data branch by coupling the power supply node to the power supply rail of the second set of logic gates in the second data branch based upon a transmitting state of the CDAC cell.

In Example 37, the subject matter of one or more of Examples 31-36, wherein the at least one of the plurality of logic means includes an inverter.

In Example 38, the subject matter of one or more of Examples 31-37, wherein the logic circuitry means couples the power supply node to the power supply rail to cause the power supply rail to have a voltage equal to that of the power supply node when the transmitting state of the CDAC cell is such that the CDAC cell is on during a data transmission via the wireless device.

In Example 39, the subject matter of one or more of Examples 31-38, wherein the logic circuitry means coupled the power supply node to the power supply rail to cause the power supply rail to have a voltage that is higher than that of the power supply node when the transmitting state of the CDAC cell is such that the CDAC cell is off during a data transmission via the wireless device.

In Example 40, the subject matter of one or more of Examples 31-39, wherein the logic circuitry means decouples the power supply node from the power supply rail when the transmitting state of the CDAC cell is such that a data transmission is not occurring via the wireless device.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A capacitive radio frequency digital to analog converter (CDAC) cell, comprising:
   a plurality of logic gates; and
   logic circuitry coupled to (i) a power supply node of the CDAC cell, and (ii) a power supply rail of one of the plurality of logic gates,
   wherein the logic circuitry is configured to selectively adjust a voltage provided at the power supply rail by coupling the power supply node to the power supply rail based upon a transmitting state of the CDAC cell.

2. The CDAC cell of claim 1, wherein:
   the power supply node is a negative power supply node,
   the power supply rail is a negative power supply rail, and
   the logic circuitry is configured to adjust the voltage provided at the power supply rail to be one of (i) a voltage associated with the negative power supply node, or (ii) a voltage higher than the voltage associated with the negative power supply node.

3. The CDAC cell of claim 1, wherein the logic circuitry includes a first transistor configured to selectively couple the power supply node to the power supply rail based upon a logic state of a first control signal.

4. The CDAC cell of claim 3, wherein the logic circuitry further includes a second transistor and a third transistor connected in series with one another, and
   wherein the second transistor and the third transistor are each configured to selectively couple the power supply node to the power supply rail through the series-connected second transistor and third transistor based upon a logic state of a second control signal.

5. The CDAC cell of claim 3, wherein the logic circuitry further includes a diode coupled between the power supply node and the power supply rail, the diode being configured to provide a voltage at the power supply rail that is greater than that of the power supply node when the first transistor is not conducting based upon the logic state of the first control signal.

6. The CDAC cell of claim 1, wherein:
   the CDAC cell is a differential CDAC cell including a first data branch and a second data branch,
   the plurality of logic gates include a first set of logic gates in the first data branch and a second set of logic gates in the second branch, and
   the logic circuitry includes:
      a first set of logic circuitry configured to selectively adjust a voltage provided at a power supply rail of one of the first set of logic gates in the first data branch by coupling the power supply node to the power supply rail of the first set of logic gates in the first data branch based upon the transmitting state of the CDAC cell; and
      a second set of logic circuitry configured to selectively adjust a voltage provided at a power supply rail of one of the second set of logic gates in the second data branch by coupling the power supply node to the power supply rail of the second set of logic gates in the second data branch based upon the transmitting state of the CDAC cell.

7. The CDAC cell of claim 1, wherein one of the plurality of logic gates includes an inverter.

8. The CDAC cell of claim 1, wherein the logic circuitry is configured to couple the power supply node to the power supply rail to cause the power supply rail to have a voltage equal to that of the power supply node when the transmitting state of the CDAC cell is such that the CDAC cell is on during a data transmission.

9. The CDAC cell of claim 1, wherein the logic circuitry is configured to couple the power supply node to the power supply rail to cause the power supply rail to have a voltage that is higher than that of the power supply node when the transmitting state of the CDAC cell is such that the CDAC cell is off during a data transmission.

10. The CDAC cell of claim 1, wherein the logic circuitry is configured to decouple the power supply node from the power supply rail when the transmitting state of the CDAC cell is such that a data transmission is not occurring.

11. A wireless device, comprising:
processing circuitry;
transceiver circuitry including a plurality of capacitive radio frequency digital to analog converter (CDAC) cells forming a CDAC array, each CDAC cell from among the CDAC array including:
a plurality of logic gates; and
logic circuitry coupled to (i) a power supply node of the CDAC cell, and (ii) a power supply rail of one of the plurality of logic gates; and
a memory configured to store executable instructions that, when executed by the processing circuitry, causes the logic circuitry to selectively adjust a voltage provided at the power supply rail of the CDAC cell within the CDAC array by coupling the power supply node of the CDAC cell to the power supply rail of the CDAC cell based upon a transmitting state of the CDAC cell.

12. The wireless device of claim 11, wherein:
the power supply node is a negative power supply node, the power supply rail is a negative power supply rail, and the logic circuitry selectively adjusts the voltage provided at the power supply rail of the CDAC cell to be one of (i) a voltage associated with the negative power supply node, or (ii) a voltage higher than the voltage associated with the negative power supply node.

13. The wireless device of claim 11, wherein the logic circuitry includes a first transistor configured to selectively couple the power supply node to the power supply rail based upon a logic state of a first control signal that is controlled via the processing circuitry executing the executable instructions stored in the memory.

14. The wireless device of claim 13, wherein the logic circuitry further includes a second transistor and a third transistor connected in series with one another, and
wherein the second transistor and the third transistor are each configured to selectively couple the power supply node to the power supply rail through the series-connected second transistor and third transistor based upon a logic state of a second control signal that is controlled via the processing circuitry executing the executable instructions stored in the memory.

15. The wireless device of claim 13, wherein the logic circuitry further includes a diode coupled between the power supply node and the power supply rail, the diode being configured to provide a voltage at the power supply rail that is greater than that of the power supply node when the first transistor is not conducting based upon the logic state of the first control signal that is controlled via the processing circuitry executing the executable instructions stored in the memory.

16. The wireless device of claim 11, wherein:
the CDAC cell is a differential CDAC cell including a first data branch and a second data branch,
the plurality of logic gates include a first set of logic gates in the first data branch and a second set of logic gates in the second branch, and
the logic circuitry includes:
a first set of logic circuitry configured to selectively adjust a voltage provided at a power supply rail of one of the first set of logic gates in the first data branch by coupling the power supply node to the power supply rail of the first set of logic gates in the first data branch based upon a transmitting state of the CDAC cell, and
a second set of logic circuitry configured to selectively adjust a voltage provided at a power supply rail of one of the second set of logic gates in the second data branch by coupling the power supply node to the power supply rail of the second set of logic gates in the second data branch based upon a transmitting state of the CDAC cell.

17. The wireless device of claim 11, wherein one of the plurality of logic gates includes an inverter.

18. The wireless device of claim 11, wherein the logic circuitry is configured to couple the power supply node to the power supply rail to cause the power supply rail to have a voltage equal to that of the power supply node when the transmitting state of the CDAC cell is such that the CDAC cell is on during a data transmission via the wireless device.

19. The wireless device of claim 11, wherein the logic circuitry is configured to couple the power supply node to the power supply rail to cause the power supply rail to have a voltage that is higher than that of the power supply node when the transmitting state of the CDAC cell is such that the CDAC cell is off during a data transmission via the wireless device.

20. The wireless device of claim 11, wherein the logic circuitry is configured to decouple the power supply node from the power supply rail when the transmitting state of the CDAC cell is such that a data transmission is not occurring via the wireless device.

* * * * *